US012672548B2

(12) United States Patent (10) Patent No.: US 12,672,548 B2
Ohda et al. (45) Date of Patent: Jun. 30, 2026

(54) SEMICONDUCTOR DEVICE AND METHOD OF PRODUCING THE SAME

(71) Applicant: Kioxia Corporation, Tokyo (JP)

(72) Inventors: Toshihiko Ohda, Yokkaichi Mie (JP);
Yuusuke Takano, Yokkaichi Mie (JP)

(73) Assignee: KIOXIA CORPORATION, Tokyo (JP)

( * ) Notice: Subject to any disclaimer, the term of this
patent is extended or adjusted under 35
U.S.C. 154(b) by 389 days.

(21) Appl. No.: 18/539,487

(22) Filed: Dec. 14, 2023

(65) Prior Publication Data

US 2024/0203901 A1    Jun. 20, 2024

(30) Foreign Application Priority Data

Dec. 19, 2022    (JP) ................................. 2022-202431

(51) Int. Cl.
H10W 42/20        (2026.01)
H10W 70/685      (2026.01)
H10W 74/01        (2026.01)
H10W 74/10        (2026.01)
H10W 74/15        (2026.01)
H10W 90/00        (2026.01)
H10W 90/24        (2026.01)

(52) U.S. Cl.
CPC ......... H10W 42/20 (2026.01); H10W 70/685
(2026.01); H10W 74/01 (2026.01); **H10W
74/117 (2026.01); H10W 74/121** (2026.01);
H10W 90/00 (2026.01); H10W 74/15
(2026.01); H10W 90/24 (2026.01); **H10W
90/724 (2026.01); H10W 90/734** (2026.01)

(58) Field of Classification Search
CPC . H10W 42/20; H10W 70/685; H10W 74/117;
H10W 74/121
See application file for complete search history.

(56) References Cited

U.S. PATENT DOCUMENTS 10,643,955 B2    5/2020 Ling et al.
10,756,024 B2    8/2020 Kitazaki et al.
10,964,645 B2 *  3/2021 Yazaki ..................... B32B 3/08
(Continued)

FOREIGN PATENT DOCUMENTS

JP        2006-156798 A      6/2006
JP        2006-310629 A      11/2006
(Continued)

*Primary Examiner* — Steven M Page
(74) *Attorney, Agent, or Firm* — Foley & Lardner LLP

(57)        ABSTRACT

A semiconductor device includes a wiring board having a
first surface and a ground electrode exposed to the first
surface, a stacked body provided above the first surface and
having a chip structure body and a first resin layer that seals
the chip structure body, a second resin layer that seals the
stacked body, a third resin layer provided between the wiring
board and the stacked body, and a first conductive shield
layer provided between the first resin layer and the first
surface and between the first resin layer and the second resin
layer, and being in contact with the ground electrode. The
first conductive shield layer is in contact with the side
surface of the first resin layer. When looking the ground
electrode from a direction perpendicular to the first surface,
the ground electrode is provided outside of the first resin
layer.

20 Claims, 10 Drawing Sheets

(56) References Cited

U.S. PATENT DOCUMENTS

| | | | | |
|---|---|---|---|---|
| 11,004,837 | B2 * | 5/2021 | Fujimaki | H10W 40/10 |
| 2006/0113642 | A1 * | 6/2006 | Kajiki | H10W 42/20 257/E23.079 |
| 2006/0244131 | A1 | 11/2006 | Kobayashi et al. | |
| 2013/0214396 | A1 * | 8/2013 | Kim | H10W 42/20 257/659 |
| 2015/0171021 | A1 * | 6/2015 | Takano | H10W 42/20 257/659 |
| 2019/0287919 | A1 | 9/2019 | Sano | |
| 2020/0185354 | A1 * | 6/2020 | Iwamoto | H10P 72/74 |

FOREIGN PATENT DOCUMENTS

| | | | |
|---|---|---|---|
| JP | 2010-109274 | A | 5/2010 |
| JP | 2011-142229 | A | 7/2011 |

* cited by examiner

SEMICONDUCTOR DEVICE AND METHOD OF PRODUCING THE SAME

CROSS-REFERENCE TO RELATED APPLICATION(S)

This application is based upon and claims the benefit of priority from Japanese Patent Application No. 2022-202431, filed Dec. 19, 2022, the entire contents of which are incorporated herein by reference.

FIELD

Embodiments described herein relate generally to a semiconductor device.

BACKGROUND

A semiconductor device such as a NAND flash memory is stacked on a wiring board and includes a stacked body having a semiconductor chip.

DESCRIPTION OF THE DRAWINGS

FIG. 1 is a schematic cross-sectional view illustrating a structure example of a semiconductor device.

FIG. 2 is a schematic plan view illustrating a structure example of the semiconductor device.

FIG. 6 is a schematic cross-sectional view illustrating natural oxide film removing step S3.

FIG. 7 is a schematic cross-sectional view illustrating conductive shield layer forming step S4.

FIG. 14 is a schematic cross-sectional view illustrating a second modification of the semiconductor device.

FIG. 15 is a schematic cross-sectional view illustrating a third modification of the semiconductor device.

DETAILED DESCRIPTION

Figure 3:
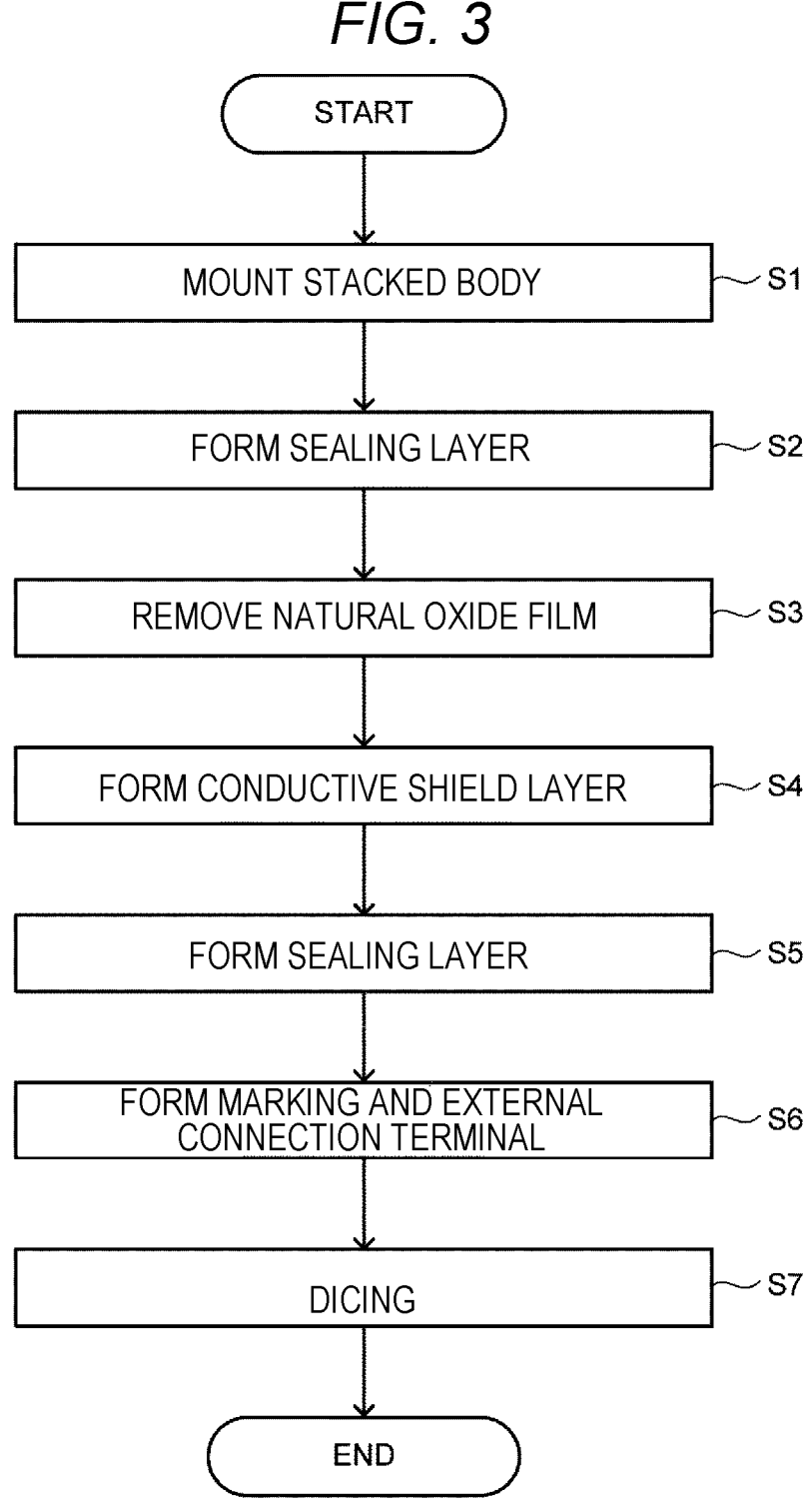
FIG. 3 is a flowchart illustrating an example of a method of producing the semiconductor device.

Embodiments provide a semiconductor device having high reliability.

In general, according to at least one embodiment, a semiconductor device includes a wiring board having a first surface and a ground electrode exposed to the first surface, a stacked body provided above the first surface and having a chip structure body and a first resin layer that seals the chip structure body (e.g., the first resin layer covers surfaces of the chip structure body and/or is applied to surfaces of the chip structure body as an impervious layer), a second resin layer that seals the stacked body, a third resin layer provided between the wiring board and the stacked body, a first conductive shield layer provided between the first resin layer and the first surface and between the first resin layer and the second resin layer and being in contact with the ground electrode. The first conductive shield layer is in contact with the side surface of the first resin layer. When looking the ground electrode from a direction perpendicular to the first surface, the ground electrode is provided outside of the first resin layer.

Hereinafter, at least one embodiment will be described with reference to the drawings. A relation between a thickness and a plane surface dimension of each component illustrated in the drawings, the thickness ratio of each component, and the like may be different from those of an actual object. In addition, in the embodiment, the substantially same components will be denoted by the same reference symbols to eliminate the description in an appropriate manner.

In the present specification, excluding the case particularly specified, "connecting" sometimes means not only physically connecting but also electrically connecting.

Figures 1, 2:
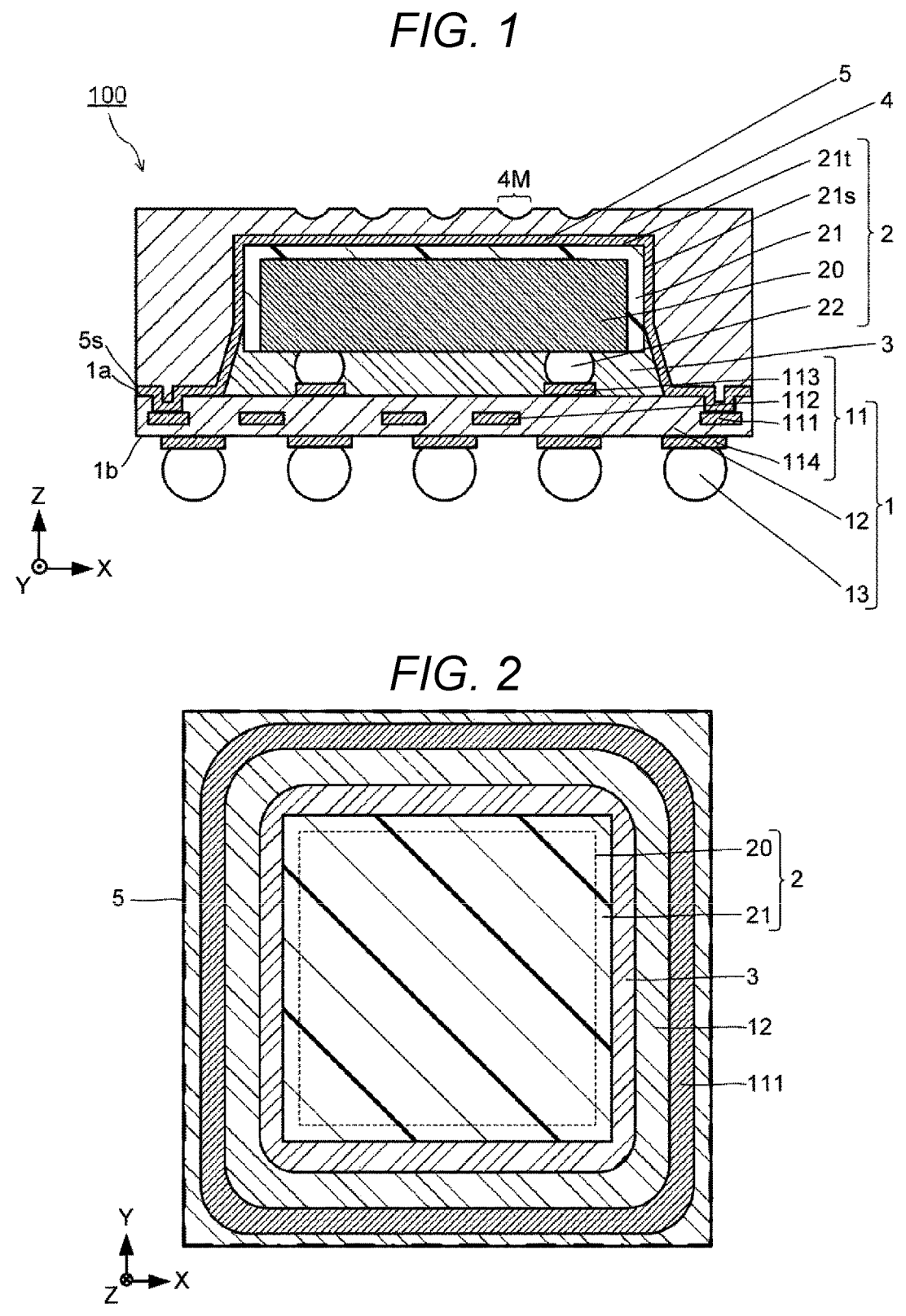

FIG. 1 is a schematic cross-sectional view illustrating a structure example of a semiconductor device. FIG. 2 is a schematic plan view illustrating a structure example of the semiconductor device. FIG. 1 and FIG. 2 indicate an X-axis, a Y-axis perpendicular to the X-axis, and a Z-axis perpendicular to the X-axis and the Y-axis. The X-axis is, for example, a direction parallel to a surface 1*a* of a wiring board 1, the Y-axis is a direction parallel to the surface 1*a* and perpendicular to the X-axis, and the Z-axis is a direction perpendicular to the surface 1*a*. FIG. 1 illustrates an example of an X-Z cross section. FIG. 2 indicates an example of an X-Y plane surface. In FIG. 2, some components are not illustrated or illustrated by a dotted line or a chain line for convenience.

A semiconductor device 100 includes the wiring board 1, a stacked body 2, a resin layer 3, a resin layer 4, and a conductive shield layer 5. In FIG. 2, the conductive shield layer 5 is illustrated by a dot chain line.

An example of the wiring board 1 includes a printed wiring board (PWB). The wiring board 1 may be formed, for example, by stacking alternately a plurality of insulation layers and a plurality of conductive layers having a predetermined pattern. An insulator such as resin, ceramic, grass may be used as an insulation layer.

The wiring board 1 has the surface 1*a* and a surface 1*b* on the opposite side of the surface 1*a*, a multilayer wiring 11, an insulator 12, and an external connection terminal 13.

The multilayer wiring 11 has a conductive layer 111, a conductive layer 112, a conductive layer 113, and a conductive layer 114.

The conductive layer 111 has a function as a ground electrode. The conductive layer 111 is provided in the wiring board 1 and exposed to the surface 1*a*. The conductive layer 111 can be electrically connected to a ground potential source when being mounted on another printed wiring board, via the conductive layer 114 and the external connection terminal 13.

The conductive layer 112 has a function as a wiring layer for supplying a power source voltage or a signal, or an electrode. The conductive layer 112 is provided in the wiring board 1, for example.

The conductive layer 113 has a function as a conductive pad. The conductive layer 113 is exposed to the surface 1a of the wiring board 1. The conductive layer 113 is electrically connected to the conductive layer 114 via a wiring layer such as the conductive layer 112 of the multilayer wiring 11. The conductive layer 113 may be connected to the conductive layer 114 via a via (not illustrated).

The conductive layer 114 has a function as a conductive pad. The conductive layer 114 is exposed to the surface 1b of the wiring board 1.

The conductive layer 111, the conductive layer 112, the conductive layer 113, and the conductive layer 114 are formed using copper, for example. The multilayer wiring 11 may include another conductive layer having a function as a wiring such as a signal line, a power source line, or a ground wire (not illustrated). In addition, the number of stacked wirings of the multilayer wiring 11 is not limited to the number illustrated in FIG. 1. The insulator 12 is formed by the plurality of the insulation layers stacked, and provided between a plurality of wirings provided on the multilayer wiring 11.

The external connection terminal 13 is provided in contact with the conductive layer 114. Although FIG. 1 illustrates a plurality of the external connection terminals 13, the number of the external connection terminals 13 is not limited to the number illustrated in FIG. 1. The external connection terminal 13 is connected to the multilayer wiring 11 via the conductive layer 114. For example, one of the external connection terminals 13 is connected to the conductive layer 111 of the multilayer wiring 11 via the conductive layer 114. Another one of the external connection terminals 13 is connected to the conductive layer 112 of the multilayer wiring 11 via the conductive layer 114. The external connection terminal 13 is formed using, for example, gold, copper, solder, or the like. The external connection terminal 13 may be formed using, for example, tin-silver-based or tin-silver-copper-based lead-free solder. Alternatively, the external connection terminal 13 may be formed using a plurality of metal materials stacked. Although FIG. 1 illustrates the external connection terminal 13 formed using a conductive ball, the external connection terminal 13 may be formed using a bump.

The stacked body 2 is provided above the surface 1a. The stacked body 2 has a chip structure body 20, a resin layer 21, and a connection terminal 22.

The chip structure body 20 includes at least one semiconductor chip. An example of the semiconductor chip includes a memory chip. The chip structure body 20 may be formed by stacking a plurality of the semiconductor chips.

The resin layer 21 is a sealing resin layer that seals the chip structure body 20. The resin layer 21 covers a part or the entirety of the chip structure body 20. The resin layer 21 has an upper surface 21t and a side surface 21s. The resin layer 21 contains an inorganic filler such as silicon oxide ($SiO_2$), and is formed using, for example, sealing resin in which the inorganic filler is mixed with organic resin or the like by a molding method such as a transfer molding method, a compression molding method, or an injection molding method.

The connection terminal 22 is provided below the chip structure body 20, and connects the semiconductor chip in the chip structure body 20 and the conductive layer 113. In other words, the chip structure body 20 is connected to the wiring board 1 using flip chip bonding. The connection terminal 22 is formed using, for example, gold, copper, solder, or the like. The connection terminal 22 may be formed using, for example, tin-silver-based or tin-silver-copper-based lead-free solder. Alternatively, the connection terminal 22 may be formed using a plurality of metal materials stacked. Although FIG. 1 illustrates the connection terminal 22 formed using a conductive ball, the connection terminal 22 may be formed using a bump. Although FIG. 1 illustrates a plurality of the connection terminals 22, the number of the connection terminals 22 is not limited to the number illustrated in FIG. 1.

The resin layer 3 is a sealing resin layer that is filled in the chip structure body 20 and in between the resin layer 21 and the wiring board 1, and seals the connection terminal 22. The resin layer 3 protects the connection terminal 22. The resin layer 3 may extend so as to being in contact with the side surface 21s of the resin layer 21 from between the resin layer 21 and the surface 1a. In other words, the side surface of the resin layer 3 does not need to be flush with the side surface 21s of the resin layer 21. This enables step disconnection of the conductive shield layer 5 to be prevented. The resin layer 3 can be formed using underfill resin, for example.

The resin layer 4 is a sealing resin layer that seals the stacked body 2. The resin layer 4 covers the resin layer 21. The resin layer 4 contains the inorganic filler such as silicon oxide ($SiO_2$), and is formed using, for example, sealing resin in which the inorganic filler is mixed with organic resin or the like by a molding method.

The resin layer 4 has a mark 4M on the surface thereof. The shape of the mark 4M is not particularly limited but is concave, for example. The mark 4M represents product information of the semiconductor device 100, for example, product number, date of production, manufacturing plant, and the like.

The conductive shield layer 5 is provided to prevent Electro-Magnetic Interference (EMI) caused by electromagnetic waves. The conductive shield layer 5 is provided between the resin layer 21 and the resin layer 4. The conductive shield layer 5 covers the resin layer 21 and is in contact with each of the upper surface 21t and the side surface 21s of the resin layer 21. The conductive shield layer 5 extends from between the resin layer 21 and the resin layer 4 to between the resin layer 4 and the wiring board 1, and is in contact with the conductive layer 111 exposed to the surface 1a. This enables the conductive shield layer 5 to be connected to the conductive layer 111 that is a ground electrode. An end surface 5s of the conductive shield layer 5 may be exposed to the side surface of the semiconductor device 100.

The conductive shield layer 5 enables electromagnetic wave noise to escape to the ground potential source or the like via the conductive layer 111, the conductive layer 114, and the external connection terminal 13. Therefore, the leakage of unnecessary electromagnetic waves emitted from the chip structure body 20 or the conductive layer 111 of the wiring board 1 can be prevented. In addition, the conductive shield layer 5 may prevent the electromagnetic wave noise emitted from the outside of the semiconductor device 100 from entering the semiconductor device 100. For example, when the semiconductor device 100 is used for an electronic communication device such as a portable terminal, the conductive shield layer 5 can prevent the electromagnetic waves emitted from the semiconductor device 100 from causing EMI, or prevent the semiconductor device 100 from malfunctioning due to radio waves.

The conductive shield layer 5 is preferably formed by a metal layer having a low electrical resistivity. The metal layer containing at least one element of, for example, copper (Cu), silver (Ag), gold (Au), chrome (Cr), iron (Fe), nickel (Ni), titanium (Ti), and aluminum (Al) is used. The thickness of the conductive shield layer 5 is preferably set on the basis of the electrical resistivity of the metal layer used.

As illustrated in FIG. 2, when looking from a Z-axis direction, it is preferable that the conductive layer 111 is provided outside of the resin layer 21. In FIG. 2, the conductive layer 111 is provided around the resin layer 21, but not limited thereto. When looking from the Z-axis direction, it is preferable that the outer edge of the resin layer 3 is provided between the conductive layer 111 and the stacked body 2. The outer edge of the resin layer 3 may have a fillet end. Consequently, the step disconnection of the conductive shield layer 5 can be prevented.

In a structure in which the resin layer 21 and the resin layer 4 are stacked, assuming that the conductive shield layer 5 is formed on the surface of the resin layer 4 using a sputtering method, the conductive shield layer 5 is easily peeled off due to a damage such as a scratch. In a case where the mark 4M is formed on the surface of the resin layer 4, formation of the conductive shield layer 5 reduces the visibility of the mark 4M. In addition, the conductive layer 111 and the conductive shield layer 5 needs to be connected to each other by exposing the conductive layer 111 in the side surface of the wiring board 1, and thus, the contact area is small and the shielding effect cannot be easily improved. In the side surface of the conductive shield layer 5, the conductive shield layer 5 easily becomes thin as approaching the wiring board 1, and thus, it takes time to form the conductive shield layer 5 with enough thickness. Even if a natural oxide film is formed on the side surface of the conductive layer 111, the conductive shield layer 5 cannot be easily removed. As a result, reduction in reliability of the semiconductor device is caused.

In response, in the semiconductor device of the embodiment, the conductive shield layer 5 is formed between the resin layer 21 and the resin layer 4, and thus, the conductive shield layer 5 is not easily damaged, enabling prevention of peeling-off of the conductive shield layer 5. Even if the mark 4M is formed on the surface of the resin layer 4, reduction in the visibility of the mark 4M can be prevented. In addition, the conductive layer 111 and the conductive shield layer 5 are connected to each other in the surface 1a of the wiring board 1, and thus, the contact area can be increased in size and the shielding effect can be improved. Even when the natural oxide film is formed on the surface of the conductive layer 111, the natural oxide film can be easily removed. Consequently, the reliability of the semiconductor device can be improved.

Next, an example of a method of producing the semiconductor device 100 will be described. An example of producing a plurality of the semiconductor devices 100 by the same process will be described as follows.

FIG. 3 is a flowchart illustrating an example of a method of producing a semiconductor device. An example of a method of producing the semiconductor device sequentially includes stacked body mounting step S1, sealing layer forming step S2, natural oxide film removing step S3, conductive shield layer forming step S4, sealing layer forming step S5, marking and external connection terminal forming step S6, and dicing step S7. These steps are not limited to the order illustrated in FIG. 3.

Figure 4:
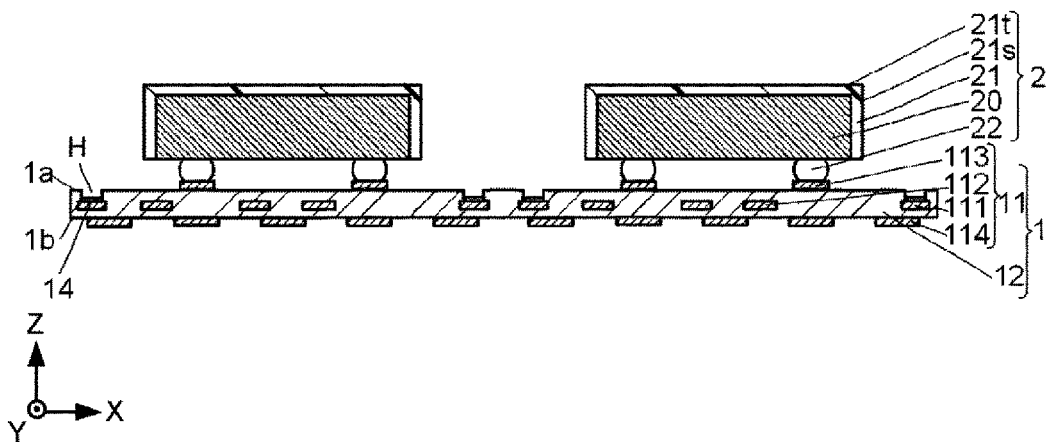
FIG. 4 is a schematic cross-sectional view illustrating stacked body mounting step S1.

FIG. 4 is a schematic cross-sectional view illustrating stacked body mounting step S1. By the stacked body mounting step S1, the stacked body 2 is prepared and mounted on the surface 1a of the wiring board 1. The wiring board 1 has an opening H for exposing the conductive layer 111 to the surface 1a thereof. The wiring board 1 has a natural oxide film 14 on the surface of the conductive layer 111 in the opening H. The stacked body 2 is mounted by flip chip bonding by connecting the conductive layer 113 exposed to the surface 1a of the wiring board 1 and the chip structure body 20 via the connection terminal 22 provided at the stacked body 2.

Figure 5:
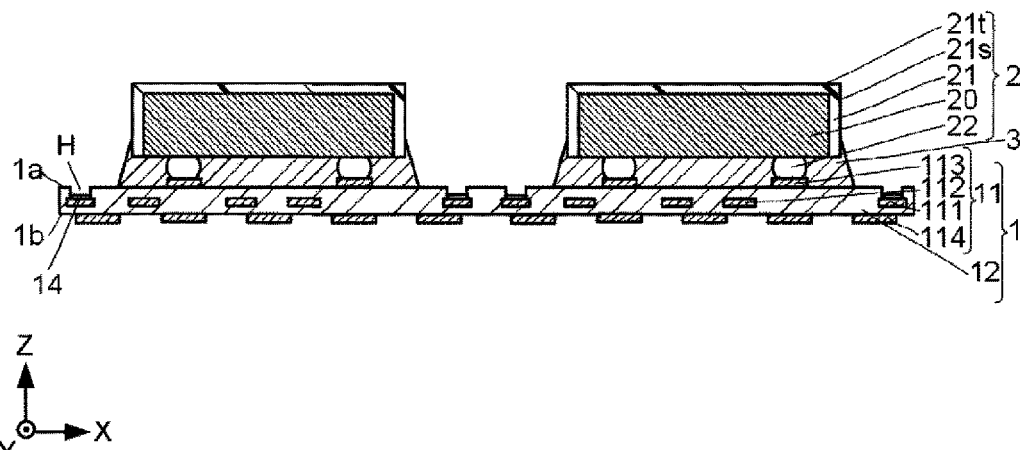
FIG. 5 is a schematic cross-sectional view illustrating sealing layer forming step S2.

FIG. 5 is a schematic cross-sectional view illustrating sealing layer forming step S2. By the sealing layer forming step S2, the resin layer 3 is formed. The resin layer 3 is formed by filling underfill resin between both of the chip structure body 20 and the resin layer 21 and the wiring board 1 and then curing the underfill resin.

Figures 6, 7:
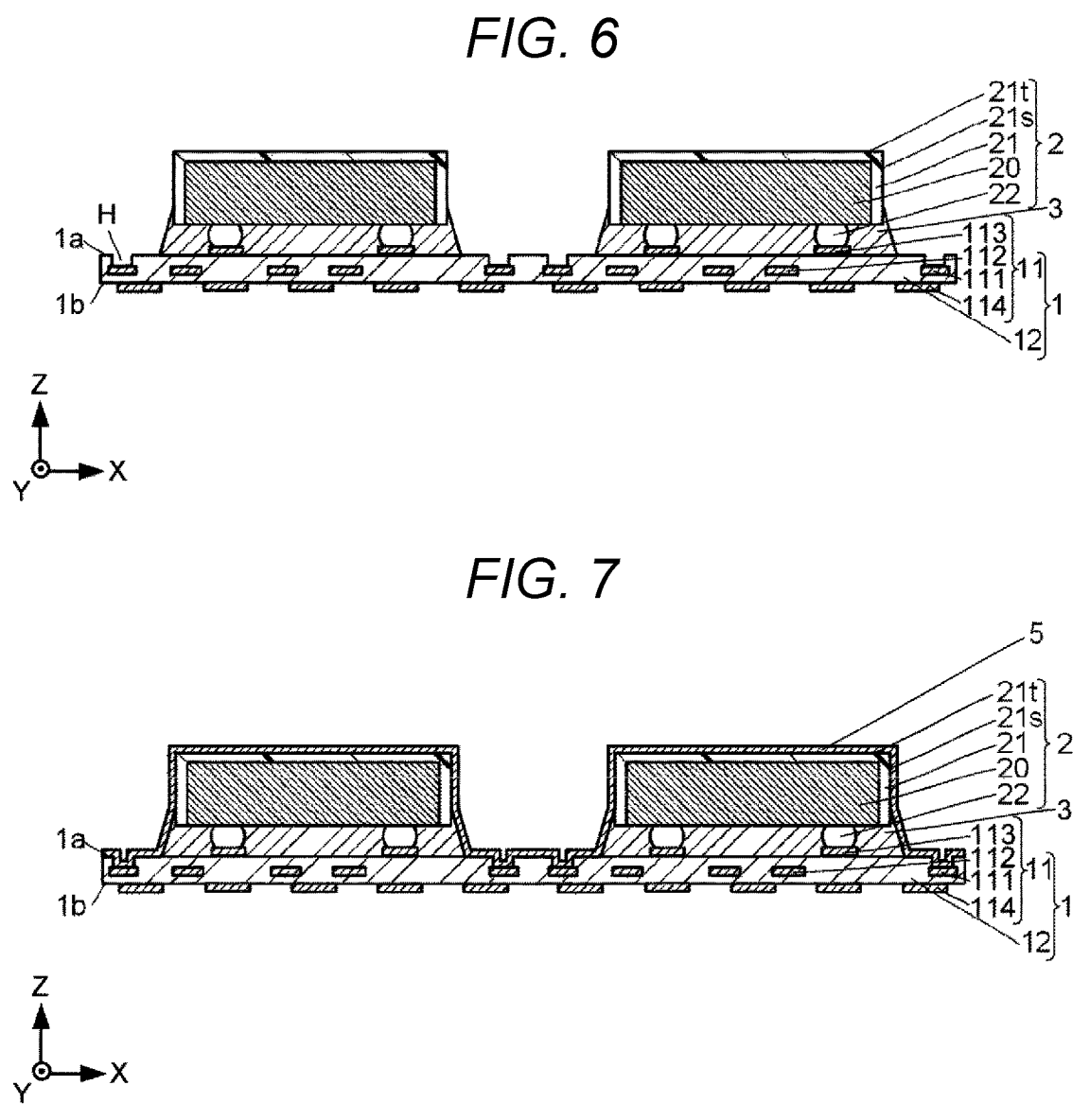

FIG. 6 is a schematic cross-sectional view illustrating natural oxide film removing step S3. By the natural oxide film removing step S3, the natural oxide film 14 is removed. The natural oxide film 14 can be removed by surface treatment using argon (Ar) plasma, for example. Although not shown, in a case where the natural oxide film 14 is formed also on the surface of the conductive layer 114, the natural oxide film is removed by the surface treatment.

FIG. 7 is a schematic cross-sectional view illustrating conductive shield layer forming step S4. By the conductive shield layer forming step S4, the conductive shield layer 5 is formed on the upper surface 21t and the side surface 21s of the resin layer 21, the surface 1a, and the conductive layer 111 so as to cover the stacked body 2. The conductive shield layer 5 is formed, for example, in the decompressed atmosphere, using a plating method or a sputtering method.

Figure 8:
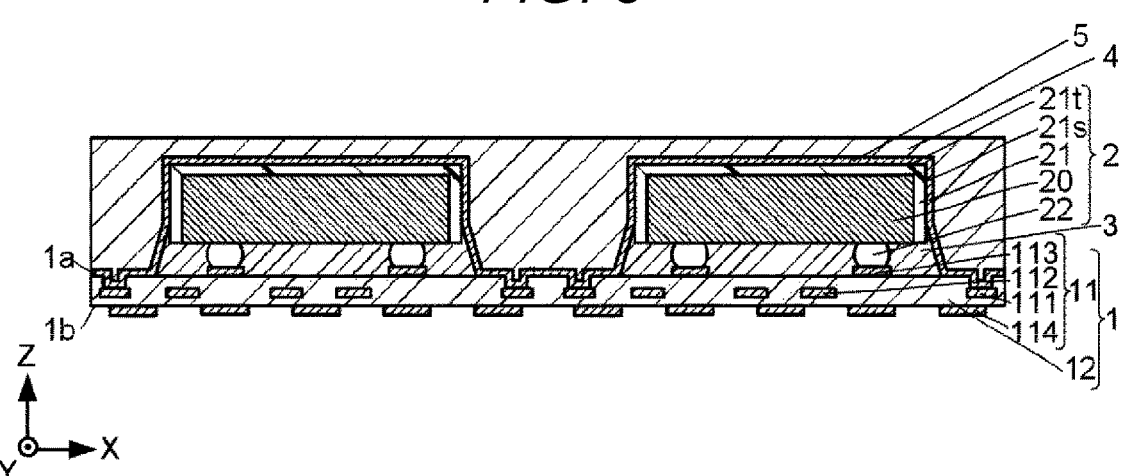
FIG. 8 is a schematic cross-sectional view illustrating sealing layer forming step S5.

FIG. 8 is a schematic cross-sectional view illustrating sealing layer forming step S5. By the sealing layer forming step S5, the resin layer 4 that covers a plurality of the stacked bodies 2 is formed on the conductive shield layer 5. The resin layer 4 is formed using, for example, sealing resin in which the inorganic filler is mixed with organic resin by a molding method such as a transfer molding method, a compression molding method, a potting method, or a printing method.

Figure 9:
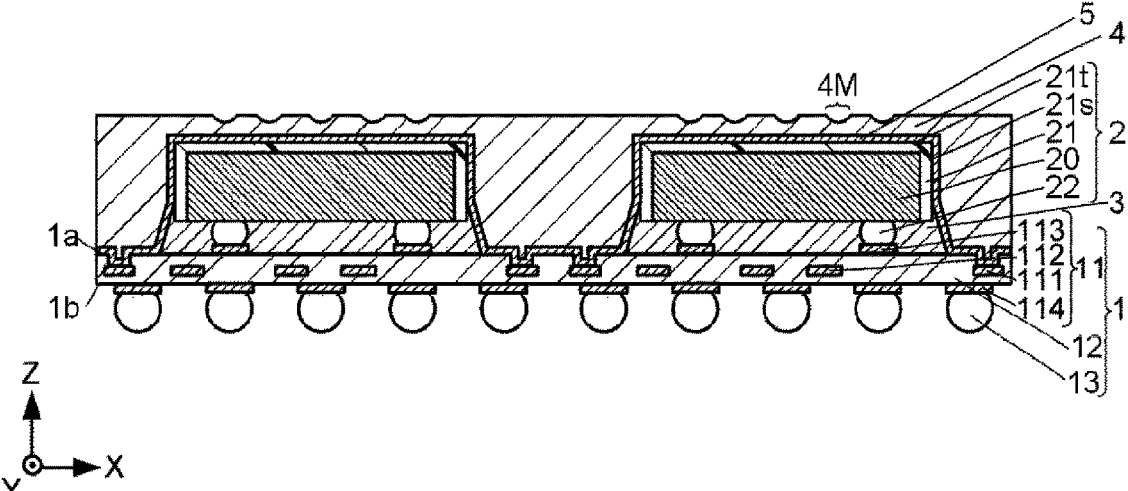
FIG. 9 is a schematic cross-sectional view illustrating marking and external connection terminal forming step S6.

FIG. 9 is a schematic cross-sectional view illustrating marking and external connection terminal forming step S6. By the marking and external connection terminal forming step S6, the mark 4M is formed. The mark 4M can be formed by stamping product information by laser marking using laser beam, for example, YAG laser. In order to obtain excellent visibility, quality and operability, the depth of the stamp is preferably 20 μm or more and 40 μm or less. Subsequently, the external connection terminal 13 in contact with the conductive layer 114 is formed.

Figure 10:
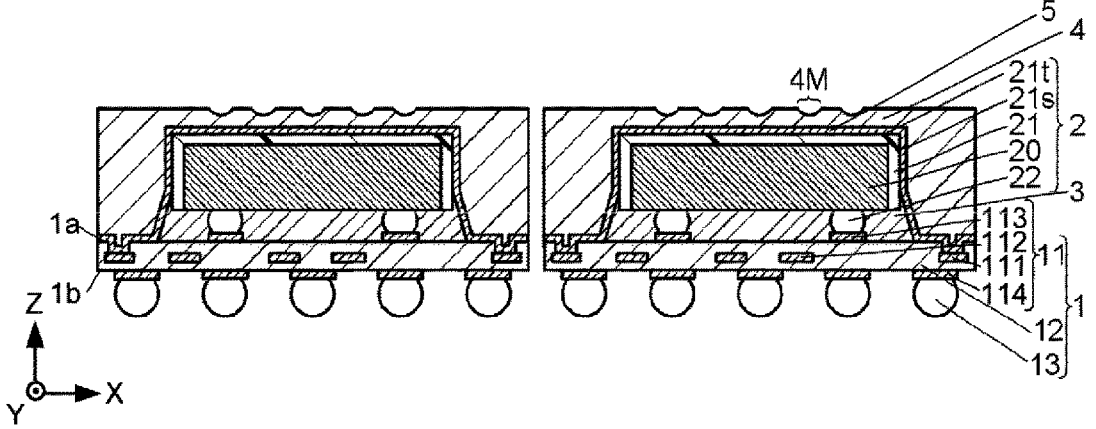
FIG. 10 is a schematic cross-sectional view illustrating dicing step S7.

FIG. 10 is a schematic cross-sectional view illustrating dicing step S7. By the dicing step S7, the semiconductor device 100 is diced for each stacked body 2 by dicing the wiring board 1, the conductive shield layer 5, and the resin layer 4 using a dicing blade.

Through the above-mentioned processes, the semiconductor device 100 can be produced. The above is a description of an example of a method of producing the semiconductor device.

First Structure Example of Chip Structure Body 20

Figure 11:
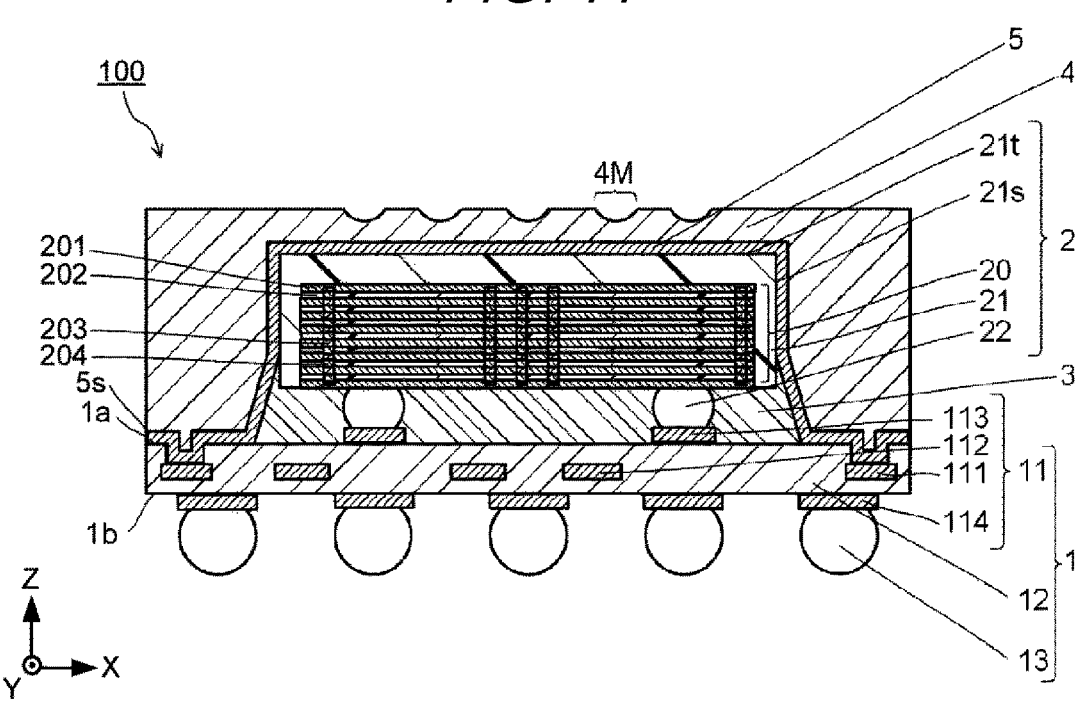
FIG. 11 is a schematic cross-sectional view illustrating a first structure example of a chip structure body 20.

FIG. 11 is a schematic cross-sectional view illustrating a first structure example of a chip structure body 20. The chip structure body 20 illustrated in FIG. 11 has a semiconductor chip 201 and an adhesive layer 202. For other parts, the description of the semiconductor device 100 illustrated in FIG. 1 can be employed in an appropriate manner.

The semiconductor chip 201 is a memory chip, for example. FIG. 11 illustrates a plurality of semiconductor chips 201. The plurality of semiconductor chips 201 is stacked on each other. The plurality of semiconductor chips 201 is sealed by the resin layer 21. One and another one of the plurality of semiconductor chips 201 are bonded with each other by the adhesive layer 202 such as a die-attach film (DAF). The plurality of semiconductor chips 201 is connected to each other via a through via 203 such as a through silicon via (TSV) provided on the semiconductor chip 201 and a bump 204 provided between one and another one of the plurality of semiconductor chips 201, and connected to the wiring board 1 via the connection terminal 22.

Second Structure Example of Chip Structure Body 20

Figure 12:
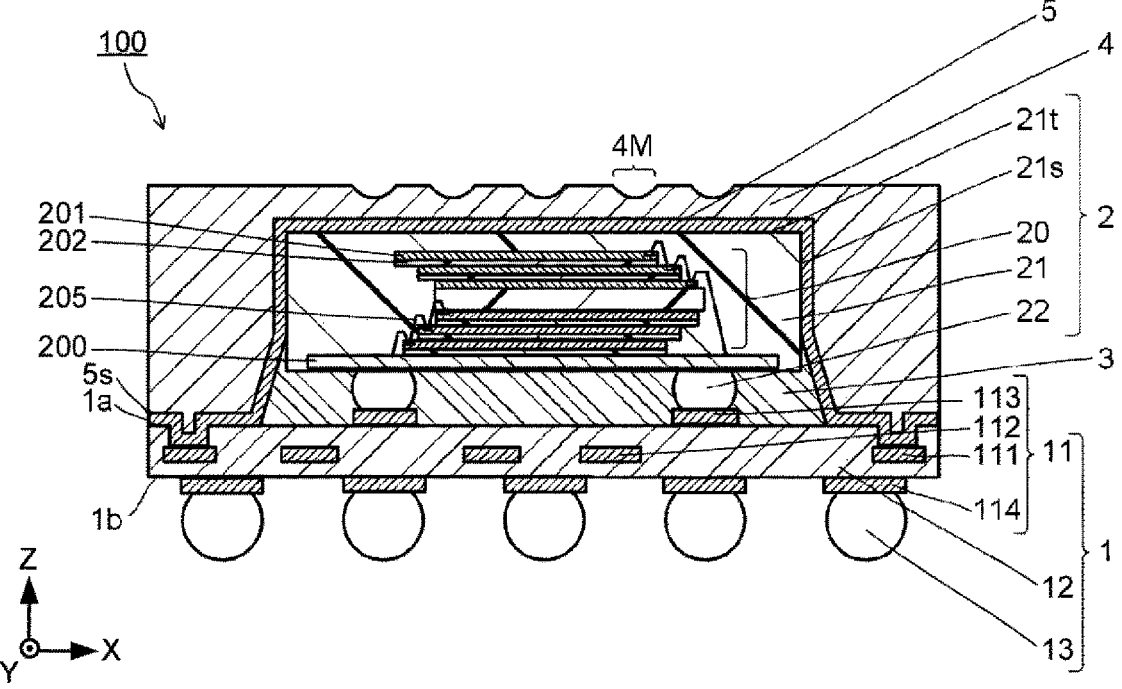
FIG. 12 is a schematic cross-sectional view illustrating a second structure example of a chip structure body 20.

FIG. 12 is a schematic cross-sectional view illustrating a second structure example of a chip structure body 20. The chip structure body 20 illustrated in FIG. 12 has a board 200, the semiconductor chip 201, and the adhesive layer 202. For other parts, the description of the semiconductor device 100 illustrated in FIG. 1 may be employed in an appropriate manner.

The board 200 is a wiring board, for example. The semiconductor chip 201 is a memory chip, for example. FIG. 12 illustrates a plurality of semiconductor chips 201. The plurality of semiconductor chips 201 is stacked on each other. The plurality of semiconductor chips 201 is sealed by the resin layer 21. One and another one of the plurality of semiconductor chips 201 are bonded with each other by the adhesive layer 202 such as DAF provided between these semiconductor chips 201. The plurality of semiconductor chips 201 is stacked in tiers above the board 200. The plurality of semiconductor chips 201 stacked in tiers is, in other words, partially superimposed on each other. The plurality of semiconductor chips 201 is connected to each other via a plurality of bonding wires 205 and further connected to the board 200. The board 200 is connected to the wiring board 1 via the connection terminal 22. As illustrated in FIG. 12, the chip structure body 20 may have a first chip stacking body in which the plurality of semiconductor chips 201 is stacked in tiers and a second chip stacking body provided on the first chip stacking body and in which the plurality of semiconductor chips 201 is stacked in tiers. The number and the stacking structure of the semiconductor chip 201 are not limited to the number and the stacking structure illustrated in FIG. 12.

As illustrated in the first structure example and the second structure example, the chip structure body 20 can be formed using the plurality of semiconductor chips 201. Consequently, a semiconductor device, for example, a NAND flash memory can be realized.

(First Modification of Semiconductor Device 100)

Figure 13:
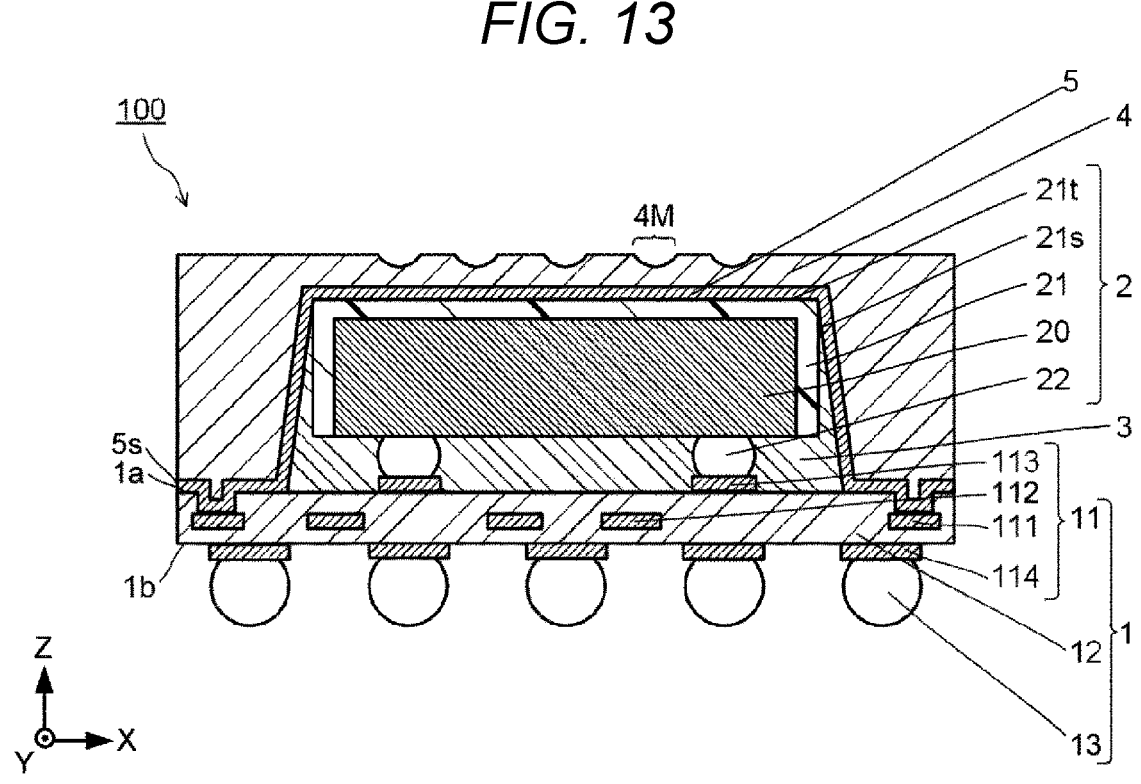
FIG. 13 is a schematic cross-sectional view illustrating a first modification of the semiconductor device.

FIG. 13 is a schematic cross-sectional view illustrating a first modification of the semiconductor device. The semiconductor device 100 illustrated in FIG. 13 is different from the semiconductor device 100 illustrated in FIG. 1 and FIG. 2 in that the resin layer 3 covers the entirety of the side surface 21s of the resin layer 21. For other parts, the description of the semiconductor device 100 illustrated in FIG. 1 may be employed in an appropriate manner.

Covering the entirety of the side surface 21s of the resin layer 21 by the resin layer 3 enables, for example, the step disconnection of the conductive shield layer 5 to be prevented. At this time, the conductive shield layer 5 covers the side surface 21s of the resin layer 21. The side surface of the resin layer 3 may be inclined with respect to the surface 1a.

(Second Modification of Semiconductor Device 100)

Figures 14, 15:
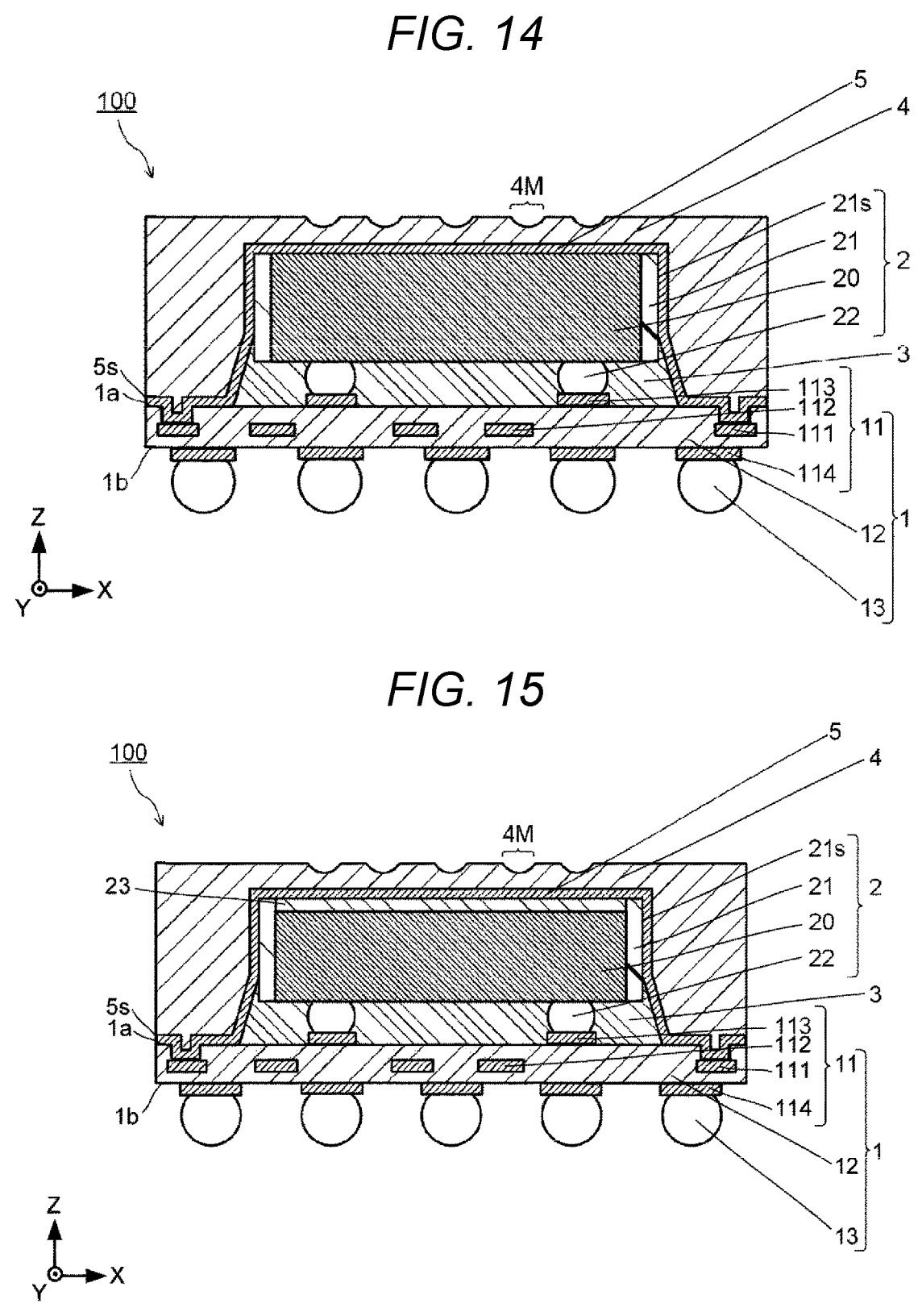

FIG. 14 is a schematic cross-sectional view illustrating a second modification of the semiconductor device. The semiconductor device 100 illustrated in FIG. 14 is different from the semiconductor device 100 illustrated in FIG. 1 and FIG. 2 in that the upper surface of the chip structure body 20 is exposed from the resin layer 21. For other parts, the description of the semiconductor device 100 illustrated in FIG. 1 may be employed in an appropriate manner.

An exposed surface of the chip structure body 20 is in contact with the conductive shield layer 5. The exposed surface of the chip stricture body 20 may be a layer including silicon, for example, a silicon substrate or the like. Exposure of the upper surface of the chip structure body 20 from the resin layer 3 allows, for example, heat dissipation of the semiconductor device 100 to be improved.

(Third Modification of Semiconductor Device 100)

FIG. 15 is a schematic cross-sectional view illustrating a third modification of the semiconductor device. The semiconductor device 100 illustrated in FIG. 15 is different from the semiconductor device 100 illustrated in FIG. 1 and FIG. 2 in that the chip structure body 20 has an insulation layer 23 such as a silicon oxide film on the upper surface thereof. For other parts, the description of the semiconductor device 100 illustrated in FIG. 1 may be employed in an appropriate manner.

The insulation layer 23 is in contact with the conductive shield layer 5. The insulation layer 23 is the silicon oxide film formed using a material such as SiO, $SiO_2$, or $Si(OC_2H_5)_4$. Having the insulation layer 23 on the upper surface of the chip structure body 20 enables, for example, the semiconductor chip in the chip structure body 20 to be protected.

(Fourth Modification of Semiconductor Device 100)

Figure 16:
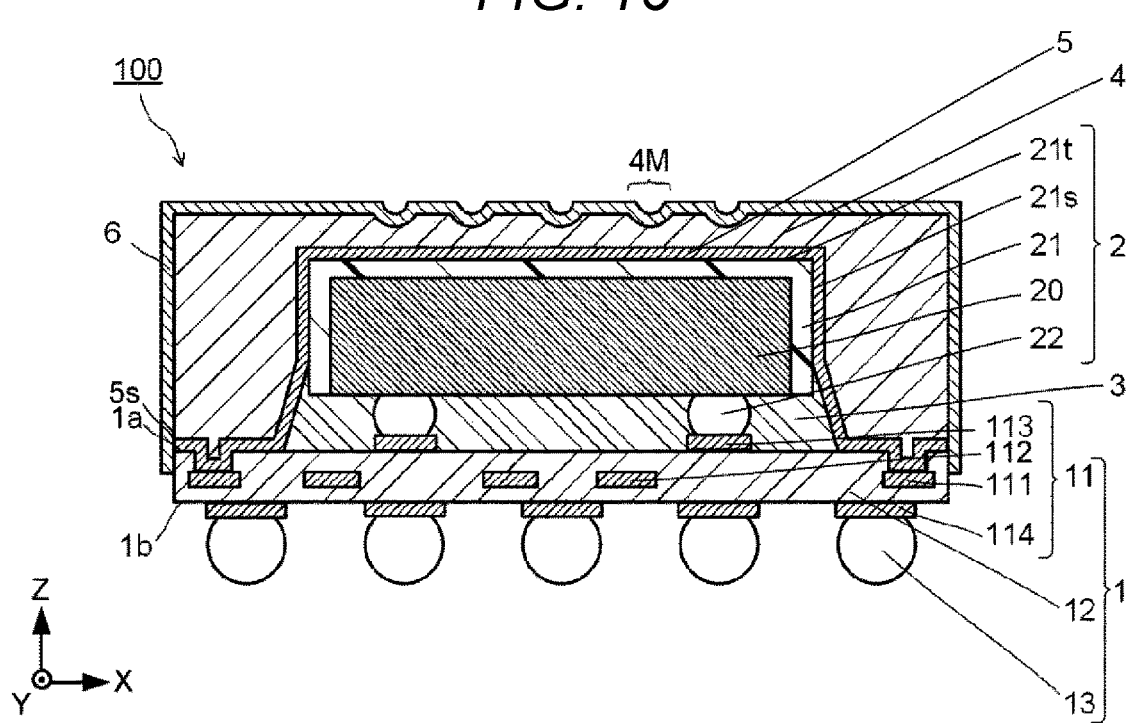
FIG. 16 is a schematic cross-sectional view illustrating a fourth modification of the semiconductor device.

FIG. 16 is a schematic cross-sectional view illustrating a fourth modification of the semiconductor device. The semiconductor device 100 illustrated in FIG. 16 is different from the semiconductor device 100 illustrated in FIG. 1 and FIG. 2 in that the resin layer 4 has a conductive shield layer 6 on the surface thereof. For other parts, the description of the semiconductor device 100 illustrated in FIG. 1 may be employed in an appropriate manner.

Similarly to the conductive shield layer 5, the conductive shield layer 6 is provided to prevent EMI or the like. The conductive shield layer 6 is preferable formed by a metal layer having a low electrical resistivity. The metal layer containing at least one element of, for example, copper, chrome, iron, nickel, titanium, and aluminum is used. The thickness of the conductive shield layer 6 is preferably set on the basis of the electrical resistivity of the metal layer used. The conductive shield layer 6 is formed, for example, in the decompressed atmosphere, using a plating method or a sputtering method. The conductive shield layer 6 can be formed using a material applicable to the conductive shield layer 5, and is formed using a material that is the same as or different from the conductive shield layer 5.

The conductive shield layer 6 is connected to the conductive shield layer 5 by contacting the end part (end surface) exposed from the side surface of the resin layer 4 of the conductive shield layer 5. Having the conductive shield layer 6 on the surface of the resin layer 4 allows the shielding effect to be further improved.

(Fifth Modification of Semiconductor Device 100)

Figure 17:
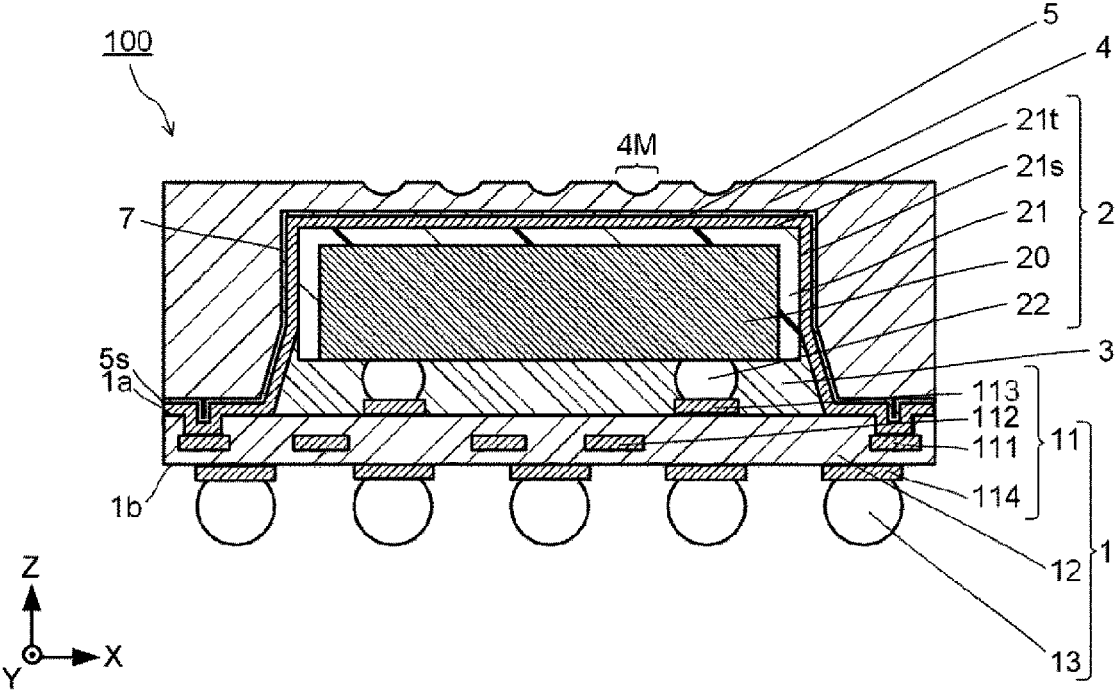
FIG. 17 is a schematic cross-sectional view illustrating a fifth modification of the semiconductor device.

FIG. 17 is a schematic cross-sectional view illustrating a fifth modification of the semiconductor device. The semiconductor device 100 illustrated in FIG. 17 is different from the semiconductor device 100 illustrated in FIG. 1 and FIG. 2 in that the semiconductor device 100 has a protective film 7 in contact with the conductive shield layer 5 between the conductive shield layer 5 and the resin layer 4. For other parts, the description of the semiconductor device 100 illustrated in FIG. 1 may be employed in an appropriate manner.

The protective film 7 includes at least one compound of copper oxide, chrome oxide, iron oxide, nickel oxide, and titanium aluminum nitride. The protective film 7 is formed after the conductive shield layer 5 is formed and before the resin layer 4 is formed. For example, in the atmosphere including oxygen, a metal oxide film may be formed as the protective film 7 by depositing metal materials on the upper surface of the conductive shield layer 5. In addition, in the atmosphere including nitrogen, a metal nitride film may be formed as the protective film 7 by depositing metal materials on the upper surface of the conductive shield layer 5. Having the protective film 7 between the conductive shield layer 5 and the resin layer 4 enables, for example, oxidation of the conductive shield layer 5 to be prevented.

(Sixth Modification of Semiconductor Device 100)

Figure 18:
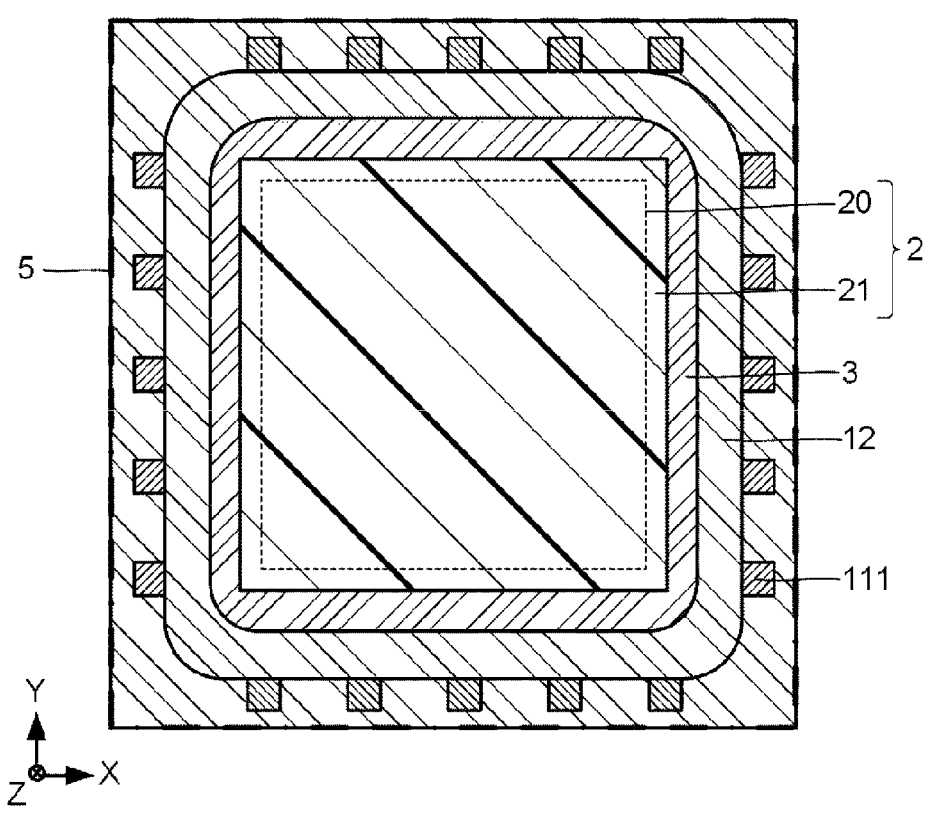
FIG. 18 is a schematic plan view illustrating a sixth modification of the semiconductor device.

FIG. 18 is a schematic plan view illustrating a sixth modification of the semiconductor device. The semiconductor device 100 illustrated in FIG. 18 is different from the semiconductor device 100 illustrated in FIG. 1 and FIG. 2 in the layout of the conductive layer 111. For other parts, the description of the semiconductor device 100 illustrated in FIG. 1 and FIG. 2 may be employed in an appropriate manner.

A plurality of conductive layers 111 are arranged with a space therebetween around the resin layer 3. As a result, for example, by differentiating the pattern shapes of the plurality of conductive layers 111, complicated patterns can be formed.

The first to sixth modification examples can be combined in an appropriate manner. Furthermore, the first to sixth modification examples may apply the first structure example or the second structure example of the chip structure body 20 in an appropriate manner.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:

a wiring board having a first surface and a ground electrode, the ground electrode exposed to the first surface;

a stacked body disposed above the first surface and having a chip structure body and a first resin layer, the first resin layer sealing the chip structure body;

a second resin layer sealing the stacked body;

a third resin layer disposed between the wiring board and the stacked body; and a first conductive shield layer disposed between the first resin layer and the first surface and disposed between the first resin layer and the second resin layer, and the first conductive shield layer being in contact with the ground electrode, wherein the first conductive shield layer is in contact with a side surface of the first resin layer, and when looking toward the ground electrode from a direction perpendicular to the first surface, the ground electrode is disposed outside of the first resin layer.

2. The semiconductor device according to claim 1, wherein the first conductive shield layer contains at least one element selected from a group including copper, silver, gold, chrome, iron, nickel, titanium, and aluminum.

3. The semiconductor device according to claim 1, further comprising:

a protective film disposed between the first conductive shield layer and the second resin layer, the protective film being in contact with the first conductive shield layer, wherein the protective film includes at least one compound selected from a group including copper oxide, chrome oxide, iron oxide, nickel oxide, and titanium aluminum nitride.

4. The semiconductor device according to claim 1, wherein when looking toward the third resin layer from a direction perpendicular to the first surface, an outer edge of the third resin layer is disposed between the ground electrode and the stacked body.

5. The semiconductor device according to claim 4, wherein the third resin layer extends from between the wiring board and the stacked body to the side surface of the first resin layer.

6. The semiconductor device according to claim 1, wherein the chip structure body includes a plurality of semiconductor chips, and the plurality of semiconductor chips are stacked on each other.

7. The semiconductor device according to claim 1, wherein the stacked body includes a layer in contact with the first conductive shield layer between the chip structure body and the first conductive shield layer, and the layer includes at least one of silicon or silicon oxide.

8. The semiconductor device according to claim 1, wherein an end part of the first conductive shield layer is exposed from the second resin layer.

9. The semiconductor device according to claim 8, further comprising:

a second conductive shield layer covering the second resin layer, wherein the second conductive shield layer is in contact with the end part of the first conductive shield layer, wherein the end part is exposed from the second resin layer.

10. A method of producing a semiconductor device comprising:

forming a stacked body having a chip structure body and a first resin layer, the first resin layer sealing the chip structure body above a first surface of a wiring board;

forming a third resin layer between the wiring board and the stacked body;

forming a first conductive shield layer in contact with a ground electrode disposed on the wiring board and exposed to the first surface so as to cover the stacked body; and forming a second resin layer sealing the stacked body on the first conductive shield layer, wherein the first conductive shield layer is in contact with a side surface of the first resin layer, and when looking toward the ground electrode from a direction perpendicular to the first surface, the ground electrode is disposed outside of the first resin layer.

11. The method of producing the semiconductor device according to claim 10, further comprising:

containing, by the first conductive shield layer, at least one element selected from a group including copper, silver, gold, chrome, iron, nickel, titanium, and aluminum.

12. The method of producing the semiconductor device according to claim 10, further comprising:

forming a protective film disposed between the first conductive shield layer and the second resin layer and the protective film being in contact with the first conductive shield layer, wherein the protective film includes at least one compound selected from a group including copper oxide, chrome oxide, iron oxide, nickel oxide, and titanium aluminum nitride.

13. The method of producing the semiconductor device according to claim 10, wherein when looking toward the third resin layer from a direction perpendicular to the first surface, an outer edge of the third resin layer is disposed between the ground electrode and the stacked body.

14. The method of producing the semiconductor device according to claim 13, wherein the third resin layer extends from between the wiring board and the stacked body to the side surface of the first resin layer.

15. The method of producing the semiconductor device according to claim 10, wherein the chip structure body includes a plurality of semiconductor chips, and the plurality of semiconductor chips is stacked on each other.

16. The method of producing the semiconductor device according to claim 10, wherein the stacked body includes a layer in contact with the first conductive shield layer between the chip structure body and the first conductive shield layer, and the layer includes at least one of silicon or silicon oxide.

17. The method of producing the semiconductor device according to claim 10, wherein an end part of the first conductive shield layer is exposed from the second resin layer.

18. The method of producing the semiconductor device according to claim 17, further comprising:

a second conductive shield layer covering the second resin layer, wherein the second conductive shield layer is in contact with the end part of the first conductive shield layer exposed from the second resin layer.

19. The semiconductor device according to claim 1, wherein the wiring board includes alternately stacked insulating layers and conductive layers.

20. The semiconductor device according to claim 1, wherein the first conductive shield layer is formed of metal.

* * * * *